United States Patent
Mayama et al.

(10) Patent No.: US 10,751,977 B2
(45) Date of Patent: Aug. 25, 2020

(54) METHOD FOR MANUFACTURING FLEXIBLE METAL-CLAD LAMINATED PLATE

(71) Applicant: ARISAWA MFG. CO., LTD., Niigata (JP)

(72) Inventors: Takayuki Mayama, Niigata (JP); Naoki Suzuki, Niigata (JP); Takashi Miwa, Niigata (JP); Shuichi Fujita, Niigata (JP); Kenji Nakamura, Niigata (JP)

(73) Assignee: Arisawa Mfg. Co., Ltd., Joetsu-shi, Niigata (JP)

( * ) Notice: Subject to any disclaimer, the term of this patent is extended or adjusted under 35 U.S.C. 154(b) by 0 days.

(21) Appl. No.: 16/305,891

(22) PCT Filed: May 29, 2017

(86) PCT No.: PCT/JP2017/019937
§ 371 (c)(1),
(2) Date: Nov. 30, 2018

(87) PCT Pub. No.: WO2017/209060
PCT Pub. Date: Dec. 7, 2017

(65) Prior Publication Data
US 2019/0184680 A1 Jun. 20, 2019

(30) Foreign Application Priority Data
Jun. 3, 2016 (JP) .................. 2016-111447

(51) Int. Cl.
*B32B 15/088* (2006.01)
*B32B 7/12* (2006.01)
(Continued)

(52) U.S. Cl.
CPC ............ *B32B 15/088* (2013.01); *B29C 65/02* (2013.01); *B29C 65/4815* (2013.01);
(Continued)

(58) Field of Classification Search
CPC .................................................. B32B 15/088
See application file for complete search history.

(56) References Cited

U.S. PATENT DOCUMENTS

2006/0048963 A1* 3/2006 Nishinaka ................. B32B 7/12
174/393

FOREIGN PATENT DOCUMENTS

JP 2004-90247 A 3/2004
JP 2004090247 A * 3/2004
(Continued)

*Primary Examiner* — Daniel H Lee
(74) *Attorney, Agent, or Firm* — Wolf, Greenfield & Sacks, P.C.

(57) ABSTRACT

A method for manufacturing a flexible metal-clad laminated plate includes the steps of: (a) obtaining a laminated body by laminating a polyimide resin film including a non-thermoplastic polyimide layer and an adhesive layer containing thermoplastic polyimide, the adhesive layer being provided on at least one side of the non-thermoplastic polyimide layer, and a metal foil; and (b) subjecting the laminated body obtained in the step (a) to heat treatment under an inert gas atmosphere and a pressure of 0.20 to 0.98 MPa at a temperature of a glass transition temperature Tg of the thermoplastic polyimide−20° C. to the glass transition temperature Tg+50° C.

20 Claims, 1 Drawing Sheet

(51) Int. Cl.
  *B32B 27/34* (2006.01)
  *B29C 65/48* (2006.01)
  *B29C 65/00* (2006.01)
  *B32B 37/12* (2006.01)
  *H05K 1/03* (2006.01)
  *B29C 65/02* (2006.01)
  *B32B 15/20* (2006.01)
  *B32B 38/00* (2006.01)
  *B29L 31/34* (2006.01)

(52) U.S. Cl.
  CPC .... *B29C 66/00141* (2013.01); *B29C 66/1122* (2013.01); *B29C 66/45* (2013.01); *B29C 66/71* (2013.01); *B29C 66/73117* (2013.01); *B29C 66/742* (2013.01); *B29C 66/91943* (2013.01); *B29C 66/91945* (2013.01); *B29C 66/929* (2013.01); *B32B 7/12* (2013.01); *B32B 15/20* (2013.01); *B32B 27/34* (2013.01); *B32B 37/12* (2013.01); *B32B 37/1207* (2013.01); *B32B 38/0036* (2013.01); *H05K 1/03* (2013.01); *B29C 66/7422* (2013.01); *B29C 66/74281* (2013.01); *B29C 66/74285* (2013.01); *B29C 66/949* (2013.01); *B29L 2031/3425* (2013.01); *B32B 2037/1223* (2013.01); *B32B 2250/05* (2013.01); *B32B 2266/045* (2013.01); *B32B 2309/02* (2013.01); *B32B 2309/04* (2013.01); *B32B 2309/12* (2013.01); *B32B 2309/62* (2013.01); *B32B 2309/68* (2013.01); *B32B 2311/12* (2013.01); *B32B 2377/00* (2013.01); *B32B 2379/08* (2013.01); *B32B 2457/08* (2013.01)

(56) References Cited

FOREIGN PATENT DOCUMENTS

| | | | |
|---|---|---|---|
| JP | 2005-119178 A | | 5/2005 |
| JP | 2005-193404 A | | 7/2005 |
| JP | 2006-306973 A | | 11/2006 |
| JP | 2006306973 A | * | 11/2006 |
| JP | 2007-223205 A | | 9/2007 |
| JP | 2010-125793 A | | 6/2010 |
| JP | 2015-51636 A | | 3/2015 |

* cited by examiner

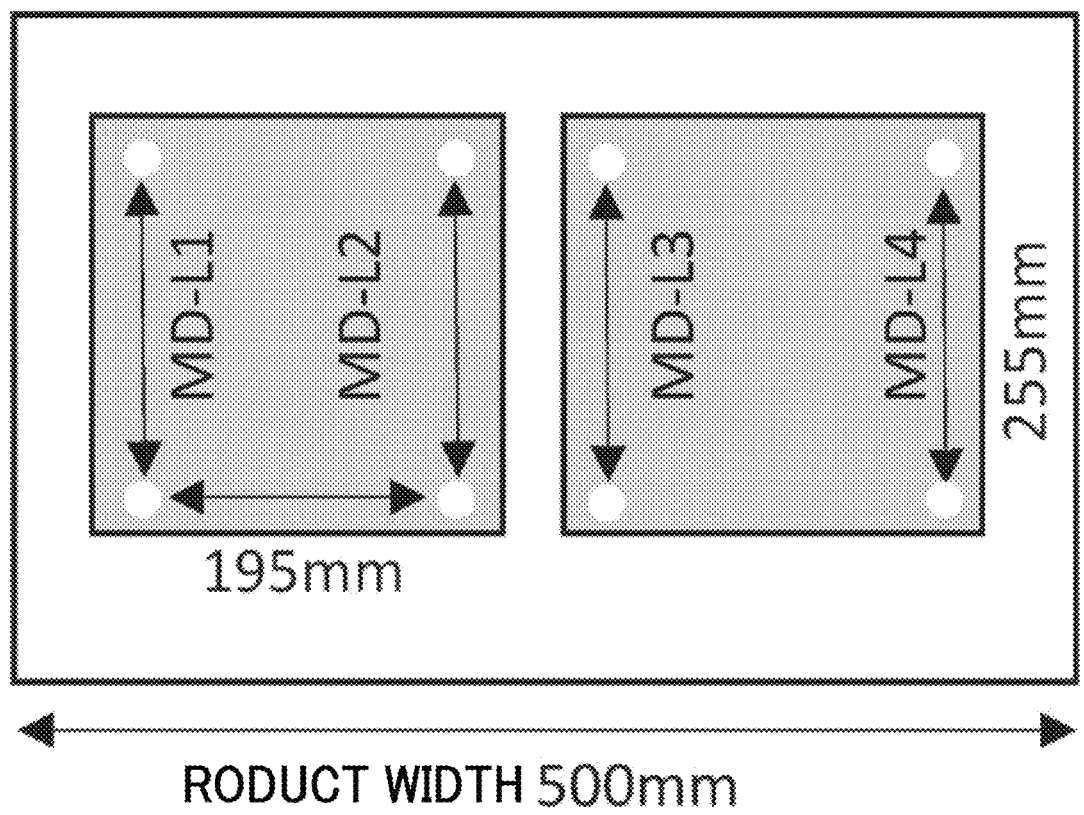

METHOD FOR MANUFACTURING FLEXIBLE METAL-CLAD LAMINATED PLATE

RELATED APPLICATIONS

The present application is a National Phase of International Application Number PCT/JP2017/019937, filed May 29, 2017, which claims priority to JP2016-111447 filed Jun. 3, 2016.

TECHNICAL FIELD

The present invention relates to a method for manufacturing a flexible metal-clad laminated plate.

BACKGROUND ART

In the field of electronic materials, materials for flexible printed circuit (FPC) boards such as cover lays and flexible metal-clad laminated plates have been heretofore used in which a resin layer having electric insulation quality, such as a polyimide film or a polyamide film; an adhesive layer mainly composed of an epoxy resin or a polyimide resin; a metal foil layer having electrical conductivity, such as a copper foil, a silver foil or an aluminum foil; and so on are appropriately combined. As metal-clad laminated plates, two-layer flexible metal-clad laminated plates including a metal layer and a polyimide resin layer, and three-layer flexible metal laminated plates including a metal layer, a polyimide resin layer and an adhesive layer are mainly known.

In recent years, for achieving further downsizing and weight saving of electronic devices, miniaturization of wiring to be provided on a substrate has been promoted, and components to be mounted have been downsized and densified. Thus, the problem may arise that when a large dimensional change occurs after fine wiring is formed, a mounting position of a component is deviated from that in a design stage, so that the component and a substrate are not favorably connected to each other. Heretofore, control of lamination pressure, control of the tension of an adhesion film or the like has been performed as an attempt to suppress a dimensional change. However, although a dimensional change is improved to some extent by the above-mentioned means, the improvement is not sufficient yet, and further suppression of a dimensional change has been desired.

As a means to solve the above-described problem, Patent Document 1 discloses that when a laminated body in which a protecting material and a flexible metal-clad laminated plate are in close contact with each other is conveyed after lamination with a specific tension applied in a machine direction (MD), a dimensional change can be suppressed.

In addition, Patent Document 2 discloses that when the amount of heat at an endothermic peak observed in a glass transition region is adjusted to fall within a specific range, dimensional change ratio caused by thermal shrinkage of a flexible metal foil laminated body and variations in a dimensional change can be reduced, and describes that such a laminated body is obtained by performing heat treatment for 8 hours more at a temperature lower than the glass transition point Tg of resin by 5 to 50° C.

LIST OF PRIOR ART DOCUMENTS

Patent Document

Patent Document 1: Japanese Patent Laid-Open No. 2015-51636

Patent Document 2: Japanese Patent Laid-Open No. 2005-119178

SUMMARY OF INVENTION

Problems to be Solved by Invention

However, in the flexible metal-clad laminated plate in Patent Document 1, a dimensional change within a specific region is suppressed, but the dimensional change ratio varies, and a dimensional change is not evenly suppressed over the entire laminated plate.

In addition, for the flexible printed metal foil laminated body in Patent Document 2, it is required to perform heat treatment for a long time of 8 hours or more, resulting in poor productivity. In addition, if heat treatment is performed at a higher temperature for reducing the heat treatment time, the problem arises that air contained in the laminated body is expanded to generate bulges on a surface, so that the laminated body has a poor appearance.

In view of the above-described circumstances, an object of the present invention is to provide a method for manufacturing a flexible metal-clad laminated plate, the method being capable of efficiently producing a flexible metal-clad laminated plate in which a dimensional change is evenly suppressed over the entire laminated body, and there are no bulges on a surface.

Means for Solving Problems

The present inventors have extensively conducted studies for achieving the above-described object, and resultantly found that the above-described object can be achieved by laminating a polyimide resin film in which an adhesive layer containing thermoplastic polyimide is provided on at least one side of a non-thermoplastic polyimide layer, and a metal foil and, and then subjecting the resulting laminated body to heat treatment under an inert gas atmosphere and a pressure of 0.20 to 0.98 MPa at a temperature of a glass transition temperature Tg of the thermoplastic polyimide−20° C. to the glass transition temperature Tg+50° C., leading to completion of the present invention.

Specifically, the present invention is as follows.

[1] A method for manufacturing a flexible metal-clad laminated plate, the method comprising the steps of:

(a) obtaining a laminated body by laminating a polyimide resin film including a non-thermoplastic polyimide layer and an adhesive layer containing thermoplastic polyimide, the adhesive layer being provided on at least one side of the non-thermoplastic polyimide layer, and a metal foil; and (b) subjecting the laminated body obtained in the step (a) to heat treatment under an inert gas atmosphere and a pressure of 0.20 to 0.98 MPa at a temperature of a glass transition temperature Tg of the thermoplastic polyimide−20° C. to the glass transition temperature Tg+50° C.

[2] The method according to [1], wherein in the step (a), the polyimide resin film and the metal foil are laminated by lamination.

[3] The method according to [1] or [2], wherein in the step (b), the laminated body is subjected to heat treatment at a temperature of the glass transition temperature Tg of the thermoplastic polyimide−10° C. to the glass transition temperature Tg+30° C.

[4] The method according to any one of [1] to [3], wherein a heat treatment time in the step (b) is 60 to 420 minutes.

[5] The method according to any one of [1] to [4], wherein in the step (b), the laminated body has a roll shape.

[6] The method according to any one of [1] to [5], wherein the step (b) is carried out in an autoclave.

[7] The method according to any one of [1] to [6], wherein the glass transition temperature Tg of the thermoplastic polyimide is 240 to 290° C.

[8] The method according to any one of [1] to [7], wherein the flexible metal-clad laminated plate is a single-sided metal-clad laminated plate.

[9] The method according to any one of [1] to [7], wherein the flexible metal-clad laminated plate is a double-sided metal-clad laminated plate.

Advantages of Invention

According to a manufacturing method of the present invention, a flexible metal-clad laminated plate in which a dimensional change is evenly suppressed over the entire laminated body, and there are no bulges on a surface can be efficiently produced in a short time.

BRIEF DESCRIPTION OF DRAWING

FIG. 1 illustrates a schematic view of a sample used for measurement of dimensional change ratio.

MODE FOR CARRYING OUT INVENTION

Hereinafter, a mode for carrying out the present invention (hereinafter, referred to as "the present embodiment") will be described in detail. The present invention is not limited to the following embodiment, and can be carried out while various modifications are made within the scope of the spirit of the present invention.

A method for manufacturing a flexible metal-clad laminated plate in the present embodiment comprises the steps of:

(a) obtaining a laminated body by laminating a polyimide resin film including a non-thermoplastic polyimide layer and an adhesive layer containing thermoplastic polyimide, the adhesive layer being provided on at least one side of the non-thermoplastic polyimide layer, and a metal foil; and (b) subjecting the laminated body obtained in the step (a) to heat treatment under an inert gas atmosphere and a pressure of 0.20 to 0.98 MPa at a temperature of a glass transition temperature Tg of the thermoplastic polyimide– 20° C. to the glass transition temperature Tg+50° C.

Hereinafter, the steps (a) and (b) are also referred to as a "lamination step" and a "heat treatment step", respectively.

[Step (a)]

The step (a) in the manufacturing method of the present embodiment is a step of preparing a laminated body by laminating a polyimide resin film including a non-thermoplastic polyimide layer and an adhesive layer containing thermoplastic polyimide, the adhesive layer being provided on at least one side of the non-thermoplastic polyimide layer, and a metal foil.

The non-thermoplastic polyimide to be used for the non-thermoplastic polyimide layer is obtained by, for example, copolymerizing an acid dianhydride and a diamine. As the acid dianhydride and diamine, any of an aliphatic compound, a cycloaliphatic compound and an aromatic compound can be used, but from the viewpoint of heat resistance, an aromatic tetracarboxylic dianhydride is preferable as the acid dianhydride, and an aromatic diamine is preferable as the diamine.

The acid dianhydride that forms the non-thermoplastic polyimide is, for example, at least one acid dianhydride selected from the group consisting of pyromellitic dianhydride, 2,3,6,7-naphthalenetetracarboxylic dianhydride, 3,3', 4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 4,4'-oxydiphthalic dianhydride, 2,2-bis(3, 4-dicarboxyphenyl)propane dianhydride, 3,4,9,10-perylenetetracarboxylic dianhydride, bis(3,4-dicarboxyphenyl) propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3, 4-dicarboxyphenyl)ethane dianhydride, bis(3,4-dicarboxyphenyl)sulfone dianhydride, p-phenylenebis(trimellitic acid monoester anhydride), ethylenebis(trimellitic acid monoester anhydride) and bisphenol A bis(trimellitic acid monoester anhydride), and among these acid dianhydrides, at least one acid dianhydride selected from the group consisting of pyromellitic dianhydride, 2,3,6,7-naphthalenetetracarboxylic dianhydride, 2,2',3,3'-biphenyltetracarboxylic dianhydride, 3,3',4,4'-biphenyltetracarboxylic dianhydride and 3,3',4,4'-benzophenonetetracarboxylic dianhydride is preferable from the viewpoint of heat resistance and dimensional stability.

The diamine that forms the non-thermoplastic polyimide is, for example, at least one diamine selected from the group consisting of 4,4'-diaminodiphenylpropane, 4,4'-diaminodiphenylmethane, benzidine, 3,3'-dichlorobenzidine, 3,3'-dimethylbenzidine, 2,2'-dimethylbenzidine, 3,3'-dimethoxybenzidine, 2,2'-dimethoxybenzidine, 4,4'-diaminodiphenylsulfide, 3,3'-diaminodiphenylsulfone, 4,4'-diaminodiphenylsulfone, 4,4'-oxydianiline, 3,3'-oxydianiline, 3,4'-oxydianiline, 1,5-diaminonaphthalene, 2,6-diaminonaphthalene, 4,4'-diaminodiphenyldiethylsilane, 4,4'-diaminodiphenylsilane, 4,4'-diaminosiphenylethylphosiphine oxide, 4,4'-diaminodiphenylN-methylamine, 4,4'-diaminodiphenylN-phenylamine, 1,4-diaminobenzene (p-phenylenediamine), 1,3-diaminobenzene, 1,2-diaminobenzene, bis{4-(4-aminophenoxy)phenyl}sulfone, bis{4-(3-aminophenoxy) phenyl}sulfone, 4,4'-bis(4-aminophenoxy)biphenyl, 4,4'-bis(3-aminophenoxy)biphenyl, 1,3-bis(3-aminophenoxy) benzene, 1,3-bis(4-aminophenoxy)benzene, 1,4-bis(4-aminophenoxy)benzene, 3,3'-diaminobenzophenone, 4,4'-diaminobenzophenone and 2,2-bis[4-(4-aminophenoxy) phenyl]propane, and from the viewpoint of heat resistance and dimensional stability, it is preferable that among these diamines, at least one diamine selected from the group consisting of 3,3'-dimethylbenzidine, 2,2'-dimethylbenzidine, 3,3'-dimethoxybenzidine, 2,2'-dimethoxybenzidine, 1,5-diaminonaphthalene and 1,4-diaminobenzene (p-phenylenediamine) is contained.

The glass transition temperature (Tg) of the non-thermoplastic polyimide depends on a use of the flexible metal-clad laminated plate, and therefore is not particularly limited, but is preferably 290° C. or higher, more preferably 320° C. or higher, still more preferably 340° C. or higher. When the glass transition temperature (Tg) of the non-thermoplastic polyimide is 290° C. or higher, favorable heat resistance tends to be obtained.

Herein, the glass transition temperature (Tg) can be determined from a value at an inflection point of the storage elastic modulus as measured by a dynamic viscoelasticity measuring apparatus (DMA), and specifically, it can be measured according to a method in Examples described later.

The adhesive layer in the present embodiment is a layer which is provided on at least one side of the non-thermoplastic polyimide layer, and contains thermoplastic polyimide. Examples of the thermoplastic polyimide to be used for the adhesive layer include thermoplastic polyimide, thermoplastic polyamideimide, thermoplastic polyetherimide and thermoplastic polyesterimide. Among them, thermoplastic polyesterimide is preferable from the viewpoint of low hygroscopic properties. The thermoplastic polyimide is obtained by, for example, copolymerizing an acid dianhydride and a diamine.

The acid dianhydride that forms the thermoplastic polyimide is, for example, at least one selected from the group consisting of pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 4,4'-oxydiphthalic dianhydride, 2,2-bis(3,4-dicarboxyphenyl)propane dianhydride, 3,4,9,10-perylenetetracarboxylic dianhydride, 2,2-bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, 1,2-bis(3,4-dicarboxyphenyl)ethane dianhydride, bis(3,4-dicarboxyphenyl)sulfone dianhydride, p-phenylenebis(trimellitic acid monoester anhydride), ethylenebis(trimellitic acid monoester anhydride) and bisphenol A bis(trimellitic acid monoester anhydride), and among these acid dianhydrides, at least one selected from 2,2',3,3'-biphenyltetracarboxylic dianhydride, 3,3',4,4'-biphenyltetracarboxylic dianhydride, 3,3',4,4'-benzophenonetetracarboxylic dianhydride and 4,4'-oxydiphthalic dianhydride is preferable from the viewpoint of adhesion and availability.

The diamine that forms the thermoplastic polyimide is, for example, at least one selected from the group consisting of 4,4'-diaminodiphenylpropane, 4,4'-diaminodiphenylmethane, benzidine, 3,3'-dichlorobenzidine, 3,3'-dimethylbenzidine, 2,2'-dimethylbenzidine, 3,3'-dimethoxybenzidine, 2,2'-dimethoxybenzidine, 4,4'-diaminodiphenylsulfide, 3,3'-diaminodiphenylsulfone, 4,4'-diaminodiphenylsulfone, 4,4'-oxydianiline, 3,3'-oxydianiline, 3,4'-oxydianiline, 1,5-diaminonaphthalene, 2,6-diaminonaphthalene, 4,4'-diaminodiphenyldiethylsilane, 4,4'-diaminodiphenylsilane, 4,4'-diaminosiphenylethylphosiphine oxide, 4,4'-diaminodiphenylN-methylamine, 4,4'-diaminodiphenylN-phenylamine, 1,4-diaminobenzene (p-phenylenediamine), 1,3-diaminobenzene, 1,2-diaminobenzene, bis{4-(4-aminophenoxy)phenyl}sulfone, bis{4-(3-aminophenoxy)phenyl}sulfone, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 1,4-bis(4-aminophenoxy)benzene, 1,3-bis(3-aminophenoxy)benzene, 3,3'-diaminobenzophenone, 4,4'-diaminobenzophenone and 2,2-bis[4-(4-aminophenoxy)phenyl]propane, and among these diamines, and at least one selected from the group consisting of 2,2-bis[4-(4-aminophenoxy)phenyl]propane, 4,4'-oxydianiline, 4,4'-diaminodiphenylmethane, 1,3-bis(3-aminophenoxy)benzene and 1,3-bis(4-aminophenoxy)benzene is preferable from the viewpoint of adhesion and availability.

The glass transition temperature (Tg) of the thermoplastic polyimide depends on a use of the flexible metal-clad laminated plate, and therefore is not particularly limited, but is preferably 240 to 290° C., more preferably 260 to 290° C., still more preferably 280 to 290° C. When the glass transition temperature (Tg) of the thermoplastic polyimide is 240° C. or higher, favorable heat resistance tends to be obtained, and when the glass transition temperature (Tg) is 290° C. or lower, lamination with a metal foil tends to be facilitated.

A thickness of the polyimide resin film including a non-thermoplastic polyimide layer, and an adhesive layer containing thermoplastic polyimide depends on a use of the flexible metal-clad laminated plate, and therefore is not particularly limited, but is preferably 12.5 to 50 µm, more preferably 12.5 to 25 µm. When the thickness of the polyimide resin film is less than 12.5 µm, insulation quality tends to be deteriorated, and mechanical properties such as tear resistance and breakage resistance tend to be reduced. On the other hand, when the thickness of the polyimide resin film is more than 50 µm, foaming tends to easily occur in heat treatment, or flexibility tends to be impaired.

As the polyimide resin film, a commercially available product may be used, and preferred examples thereof include "Pixeo FRS" and "Pixeo FC" (trade name) series manufactured by Kaneka Corporation, and "Upilex NVT" (trade name) series manufactured by Ube Industries, Ltd.

The metal foil in the present embodiment is not particularly limited, examples thereof include electrolytic copper foils, rolled copper foils, aluminum foils and stainless steel foils, and among them, electrolytic copper foils and rolled copper foils are preferable from the viewpoint of electrical conductivity and circuit processability. A thickness of the metal foil depends on a use of the flexible metal-clad laminated plate, and therefore is not particularly limited, but is preferably 1 to 35 µm, more preferably 9 to 18 µm. When the thickness of the metal foil is less than 1 µm, circuit defects tend to be easily induced due to pinholes, breakage and the like in preparation of a circuit board, and when the thickness of the metal foil is more than 35 µm, the lamination temperature with the polyimide resin film tends to increase, leading to reduction of productivity. In addition, a surface of the metal foil may be subjected to inorganic surface treatment by zinc plating, chromium plating or the like, or organic surface treatment with a silane coupling agent or the like.

As the metal foil, a commercially available product may be used, and preferred examples thereof include "Rolled Copper Foil BHY" (trade name) manufactured by JX Nippon Mining & Metals Corporation, and "Rolled Copper Foil ROFL" (trade name) manufactured by Fukuda Metal Foil & Powder Co., Ltd.

In the lamination step, a metal foil is laminated to one side or both sides of the non-thermoplastic polyimide layer with a thermoplastic polyimide-containing adhesive layer interposed therebetween. Examples of the process for lamination include (i) a method in which the adhesive layer is formed on at least one side of the non-thermoplastic polyimide layer to obtain a polyimide resin film, and the polyimide resin film is then laminated to the metal foil; (ii) a method in which the adhesive layer is molded in a sheet shape, and laminated to the non-thermoplastic polyimide layer to obtain a polyimide resin film, and the polyimide resin film is then laminated to the metal foil; and (iii) a method in which the adhesive layer is molded in a sheet shape, and the metal foil is laminated to the non-thermoplastic polyimide layer with the adhesive layer sandwiched therebetween.

In the case of the (i) method, the polyimide resin film can be obtained by, for example, applying a polyamic acid solution as a precursor of thermoplastic polyimide to at least one side of the non-thermoplastic polyimide layer, and imidizing the applied polyamic acid solution by performing heating and drying.

If necessary, the non-thermoplastic polyimide layer may be subjected to various surface treatments such as corona treatment, plasma treatment and coupling treatment before the adhesive layer is provided. In addition, the non-thermoplastic polyimide layer and the adhesive layer may contain one or more other components such as an organic or inorganic filler.

As a method for laminating the polyimide resin film and the metal foil in the lamination step, pressing, lamination or the like can be applied, but it is preferable to apply lamination from the viewpoint of roll formation and productivity. Lamination can be performed by, for example, a heat roll laminator having one or more pair of metal rolls, a double belt press (DBP), and in particular, the heat roll laminator has an advantage that it has a simple configuration, and is thus advantageous in terms of maintenance cost. The "heat roll laminator having one or more pairs of metal rolls" as used herein may be an apparatus having metal rolls for heating and pressurizing materials, and the specific configuration of the apparatus is not particularly limited.

In addition, a delivery apparatus for delivering materials to be laminated before the lamination step may be provided, and a winding apparatus for winding the laminated materials after the lamination step may be provided. By providing these apparatuses, productivity of the flexible metal-clad laminated plate can be further improved. The specific configurations of the delivery apparatus and the winding apparatus are not particularly limited, and examples thereof include known roll-shaped winding machines capable of winding the polyimide resin film, the metal foil or the resulting laminated body.

When the lamination step is carried out by lamination, the lamination temperature is preferably equal to or higher than the glass transition temperature Tg of the thermoplastic polyimide resin+50° C., more preferably equal to or higher than the glass transition temperature Tg+70° C. When the lamination temperature is equal to or higher than the glass transition temperature Tg+50° C., favorable adhesion tends to be obtained between the polyimide resin film and the metal foil, and when the lamination temperature is equal to or higher than the glass transition temperature Tg+70° C., the lamination speed tends to be increased, leading to further improvement of productivity. The upper limit of the lamination temperature is not particularly limited, but when the lamination temperature is excessively high, the resin may be decomposed.

The lamination speed in lamination is preferably 0.5 m/minute or more, more preferably 1.0 m/minute or more. When the lamination speed is 0.5 m/minute or more, favorable adhesion tends to be obtained, and when the lamination speed is 1.0 m/minute or more, productivity tends to be further improved.

It is advantageous to increase the lamination pressure in that the lamination temperature can be reduced, and the lamination speed can be increased, but generally, when the lamination pressure is excessively high, the dimensional change of the resulting metal-clad laminated plate tends to be exacerbated. Meanwhile, when the lamination pressure is excessively low, the resulting laminated plate tends to have poor adhesion. Thus, the lamination pressure is preferably within a range of 500 kg/m to 5000 kg/m, more preferably within a range of 1000 kg/m to 3000 kg/m. Here, the lamination pressure means a pressure applied to a material by the metal roll.

The tension of the polyimide resin film during lamination is preferably 0.1 to 20 kg/m, more preferably 0.2 to 15 kg/m, still more preferably 0.5 to 10 kg/m. When the tension is less than 0.1 kg/m, it tends to be difficult to obtain a flexible metal-clad laminated plate having a favorable appearance, and when the tension is more than 20 kg/m, dimensional stability tends to be deteriorated. Here, the tension of the polyimide resin film is a tension applied to the polyimide resin film before lamination.

[Step (b)]

The step (b) in the present embodiment is a step of subjecting the laminated body obtained in the step (a) to heat treatment under an inert gas atmosphere and a pressure of 0.20 to 0.98 MPa at a temperature of the glass transition temperature Tg of the thermoplastic polyimide−20° C. to the glass transition temperature Tg+50° C.

The heat treatment in the step (b) is performed under an inert gas atmosphere and a pressure of 0.20 to 0.98 MPa. It has been heretofore known that a copper-clad laminated plate in which a copper foil and a resin as a base material are laminated is subjected to heat treatment under an atmosphere of an inert gas such as nitrogen gas, but if the copper-clad laminated plate is subjected to heat treatment at a temperature higher than a temperature around a glass transition temperature Tg of the resin, air contained in the laminated body may be expanded to generate bulges on a surface, or the resin may be thermally decomposed. Therefore, as described in, for example, Patent Document 2, heat treatment should be performed for a long time at a temperature lower than the glass transition temperature Tg of the resin, and thus the flexible metal clad laminated plate cannot be obtained with favorable productivity.

The present inventors have found that when an adhesive layer containing thermoplastic polyimide is provided between a metal foil and a base material resin, and the resulting laminated body is subjected to heat treatment under an inert gas atmosphere and a pressure of 0.20 to 0.98 MPa, heat treatment can be performed at a higher temperature than ever before, so that productivity of a flexible metal-clad laminated plate having excellent quality can be remarkably improved.

The heat treatment step in the present embodiment is carried out under an inert gas atmosphere. When the heat treatment step is carried out in the air, the problem arises that the metal foil is oxidized in heat treatment at a high temperature, and when the heat treatment step is carried out in vacuum, air contained in the laminated body is expanded to generate bulges on a surface. The inert gas is not particularly limited, and examples thereof include nitrogen gas and argon gas, and among them, nitrogen gas is preferable from the viewpoint of availability and economic efficiency.

The pressure in the heat treatment step is 0.20 to 0.98 MPa, preferably 0.50 to 0.98 MPa, more preferably 0.70 to 0.98 MPa, still more preferably 0.90 to 0.98 MPa. When the pressure in the heat treatment step is less than 0.20 MPa, bulges are generated on a surface of the laminated plate in the case where heat treatment is performed at a high temperature, and on the other hand, when the pressure in the heat treatment step is more than 0.98 MPa, the problem arises that the equipment structure is complicated.

The pressure in the heat treatment step can be measured by a common pressure gauge.

The heat treatment temperature in the heat treatment step is the glass transition temperature Tg of the thermoplastic polyimide−20° C. to the glass transition temperature Tg+50° C., preferably the glass transition temperature Tg−20° C. to the glass transition temperature Tg+30° C., more preferably the glass transition temperature Tg−10° C. to the glass transition temperature Tg+30° C. When the heat treatment temperature is lower than the glass transition temperature Tg−20° C., productivity of the flexible metal-clad laminated plate is deteriorated, and when the heat treatment temperature is higher than the glass transition temperature Tg+50° C., the risk of generating bulges or decomposing the resin increases.

The heat treatment time in the heat treatment step depends on a type of thermoplastic polyimide and a use of the flexible metal-clad laminated plate, and therefore is not particularly limited, but is normally 60 to 420 minutes, preferably 90 to 300 minutes, more preferably 120 to 240 minutes. When the heat treatment time is 60 minutes or more, a dimensional change tends to be evenly suppressed over the entire flexible metal-clad laminated plate, and when the heat treatment time is 420 minutes or less, productivity of the flexible metal-clad laminated plate tends to be improved.

The laminated body to be subjected to heat treatment may be either a roll-shaped laminated body after the laminated body is wound by a winding apparatus, or a flat sheet-shaped laminated body after the roll is unwound, but from the viewpoint of productivity, it is preferable to subject the roll-shaped laminated body to heat treatment.

In particular, it is preferable to carry out the heat treatment step in an autoclave. When an autoclave is used, heat treatment tends to be easily performed under an inert gas atmosphere and a pressure of 0.20 to 0.98 MPa, leading to further improvement of productivity of the flexible metal-clad laminated plate.

In the flexible metal-clad laminated plate obtained using the manufacturing method of the present invention, a dimensional change is evenly suppressed over the entire laminated body, and this effect is made more remarkable by giving consideration to the linear expansion coefficient of each material. Specifically, the linear expansion coefficient of non-thermoplastic polyimide is normally equal to or less than the linear expansion coefficient of the metal foil, and the linear expansion coefficient of thermoplastic polyimide is greater than that of the metal foil. Therefore, when a polyimide resin film is prepared by combining thermoplastic polyimide having a large linear expansion coefficient and non-thermoplastic polyimide having a small linear expansion coefficient, a difference in linear expansion coefficient between the polyimide resin film and the metal foil to be laminated tends to be small, resulting in further reduction of variations in a dimensional change.

The linear expansion coefficient of thermoplastic polyimide is preferably 20 to 100 ppm, more preferably 30 to 70 ppm, still more preferably 40 to 60 ppm. In addition, the linear expansion coefficient of the non-thermal polyimide is preferably 20 ppm or less, more preferably 18 ppm or less, still more preferably 16 ppm or less.

Here, the linear expansion coefficient can be measured by TMA (e.g. "TMA-60" (trade name) manufactured by Shimadzu Corporation), and is determined from a measured value obtained when the temperature is elevated from 100° C. to 150° C. at a rate of 10° C./minute.

In the manufacturing method of the present embodiment, an adhesive layer containing thermoplastic polyimide is provided on at least one side of the non-thermoplastic polyimide layer. Here, when the adhesive layer is provided only on one side of the non-thermoplastic polyimide layer, the resulting flexible metal-clad laminated plate is a single-sided metal-clad laminated plate having a three-layer structure of non-thermoplastic polyimide layer/adhesive layer/metal foil, and when the adhesive layer is provided on both sides of the non-thermoplastic polyimide layer, the resulting flexible metal-clad laminated plate is a double-sided metal-clad laminated plate having a double-sided three-layer (five-layer) structure of metal foil/adhesive layer/non-thermoplastic polyimide layer/adhesive layer/metal foil. A laminated plate having a four-layer structure of adhesive layer/non-thermoplastic polyimide layer/adhesive layer/metal foil is categorized as a single-sided metal-clad laminated plate.

An etched surface obtained by etching the metal layer of the flexible metal-clad laminated plate in the present embodiment to a predetermined shape can be covered with a metal foil circuit covering cover lay to obtain a flexible printed circuit board. The cover lay is not particularly limited as long as it covers a metal foil circuit, and a cover lay obtained by applying an adhesive to a film of polyimide or the like, a liquid resist, a dry film resist or the like can be used. The flexible printed circuit board is suitably used as, for example, a so-called chip-on flexible printed circuit board for mounting IC chips.

The physical properties herein can be measured according to the methods described in the following Examples unless otherwise specified.

EXAMPLES

The present invention will be more specifically described below by means of Examples and Comparative Examples, but the present invention is not limited to these Examples only.

The components/material used in Examples and Comparative Examples are as follows.
(Polyimide Resin Films)
(1) Polyimide Resin Film A
"FRS-142#SW" (trade name) manufactured by Kaneka Corporation, thickness: 25 µm, the glass transition temperature Tg of thermoplastic polyimide=290° C.
(2) Polyimide Resin Film B
"FC-142" (trade name) manufactured by Kaneka Corporation, thickness: 25 µm, the glass transition temperature Tg of thermoplastic polyimide=240° C.
(Copper Foil)
"Rolled Copper Foil BHY" (trade name) manufactured by JX Nippon Mining & Metals Corporation, thickness: 12 µm The evaluation methods and measurement methods are as follows.
[Glass Transition Temperature (Tg)]

In measurement of a glass transition temperature Tg, a flexible copper-clad laminated plate subjected to removal of a copper foil part therefrom by etching and dried was used as a sample. As a measuring apparatus, "RSA-G2" (trade name) manufactured by TA Instruments was used. Measurement was performed at a temperature elevation rate of 10° C./minute, and the peak of tan δ obtained was defined as a glass transition temperature Tg (° C.).
[Dimensional Change Ratio]

Measurement was performed according to section 9.6 in JIS C 6471. Specifically, measurement was performed in the following manner.

Two samples were cut out in the cross direction from a flexible metal-clad laminated plate having a width of 500 mm, and the lengths of MD-L1, MD-L2, MD-L3 and MD-L4 were measured (initial lengths) as shown in FIG. 1. The copper foil was etched, the flexible metal-clad laminated plate was then left standing under normal conditions for 12 hours or more, and the lengths of MD-L1, MD-L2, MD-L3 and MD-L4 were then measured again (lengths after etching). Dimensional change ratios for MD-L1, MD-L2, MD-L3 and MD-L4 were calculated according to the following expression.

dimensional change ratio (%)=(length after etching−initial length)/initial length×100

A difference between the largest value and the smallest value of the dimensional change ratios for MD-L1, MD-L2, MD-L3 and MD-L4 was then determined. When the difference was 0.05% or less, the sample was rated "○", and when the difference was more than 0.05%, the sample was rated "×".

[Appearance (bulge)]

A surface of the flexible metal-clad laminated plate was visually observed. When there was no change in the number of bulges before and after heat treatment, the sample was rated "○", and when the number of bulges increased after heat treatment, the sample was rated "×".

[Assessment]

A sample rated "○" for both the dimensional change ratio and the appearance was rated "○", and a sample rated "×" for one or both of the dimensional change ratio and the appearance was rated "×".

Example 1

A polyimide resin film A having an adhesive layer on both sides, and a copper foil were laminated by a heat laminator having a pair of metal rolls ("High-Temperature Laminator for Flexible Printed Board" (trade name) manufactured by Yuri Roll Machine Co., Ltd.). The resulting laminated body was placed in an autoclave in a nitrogen gas atmosphere, and subjected to heat treatment at 270° C. under a pressure of 0.9 MPa for 120 minutes to obtain a double-sided flexible copper-clad laminated plate having a five-layer structure.

Using the obtained flexible copper-clad laminated plate, the dimensional change ratio and the appearance were evaluated. The results are shown in Table 1.

Examples 2 to 6 and Comparative Examples 1 to 5

A flexible copper-clad laminated plate was obtained by the same method as in Example 1 except that the heat treatment temperature and the pressure were changed, and the dimensional change ratio and the appearance were evaluated. The results are shown in Table 1.

Examples 7 to 10 and Comparative Examples 6 to 8

A double-sided flexible copper-clad laminated plate was obtained by the same method as in Example 1 except that a polyimide resin film B was used in place of the polyimide resin film A, and the heat treatment temperature and the pressure were changed, and the dimensional change ratio and the appearance were evaluated. The results are shown in Table 2.

TABLE 1

|  |  | Example 1 | Example 2 | Example 3 | Example 4 | Example 5 | Example 6 |
|---|---|---|---|---|---|---|---|
| TPI-Tg (° C.) | | | | 290 | | | |
| Heat treatment temperature (° C.) | | 270 | 290 | 320 | 290 | 290 | 290 |
| Pressure (MPa) | | 0.90 | 0.90 | 0.90 | 0.20 | 0.50 | 0.98 |
| Heat treatment time (minutes) | | 120 | 120 | 120 | 120 | 120 | 120 |
| Dimensional change ratio (%) | MD-L1 | +0.010 | +0.030 | +0.027 | +0.025 | +0.029 | +0.029 |
| | MD-L2 | −0.004 | +0.024 | +0.033 | +0.016 | +0.017 | +0.021 |
| | MD-L3 | −0.008 | +0.019 | +0.030 | +0.015 | +0.019 | +0.019 |
| | MD-L4 | +0.000 | +0.027 | +0.024 | +0.023 | +0.022 | +0.030 |
| | Largest value to smallest value | 0.018 | 0.011 | 0.009 | 0.010 | 0.012 | 0.011 |
| Dimensional change ratio | | ○ | ○ | ○ | ○ | ○ | ○ |
| Appearance (bulges) | | ○ | ○ | ○ | ○ | ○ | ○ |
| Assessment | | ○ | ○ | ○ | ○ | ○ | ○ |

|  |  | Comparative Example 1 | Comparative Example 2 | Comparative Example 3 | Comparative Example 4 | Comparative Example 5 |
|---|---|---|---|---|---|---|
| TPI-Tg (° C.) | | | | 290 | | |
| Heat treatment temperature (° C.) | | — | 320 | 290 | 240 | 350 |
| Pressure (MPa) | | — | normal pressure | 0.05 | 0.90 | 0.90 |
| Heat treatment time (minutes) | | 0 | 120 | 120 | 120 | 120 |
| Dimensional change ratio (%) | MD-L1 | +0.004 | +0.039 | +0.022 | −0.004 | +0.030 |
| | MD-L2 | −0.049 | +0.025 | +0.010 | −0.055 | +0.032 |
| | MD-L3 | −0.043 | +0.020 | +0.014 | −0.048 | +0.029 |
| | MD-L4 | −0.009 | +0.029 | +0.024 | −0.015 | +0.040 |
| | Largest value to smallest value | 0.053 | 0.019 | 0.014 | 0.051 | 0.011 |
| Dimensional change ratio | | X | ○ | ○ | X | ○ |
| Appearance (bulges) | | ○ | X | X | ○ | X |
| Assessment | | X | X | X | X | X |

TABLE 2

|  |  | Example 7 | Example 8 | Example 9 | Example 10 | Comparative Example 6 | Comparative Example 7 | Comparative Example 8 |
|---|---|---|---|---|---|---|---|---|
| TPI-Tg (° C.) | | | | | 240 | | | |
| Heat treatment temperature (° C.) | | 220 | 220 | 220 | 220 | — | 190 | 300 |
| Pressure (MPa) | | 0.90 | 0.20 | 0.50 | 0.98 | — | 0.90 | 0.90 |
| Heat treatment time (minutes) | | 120 | 120 | 120 | 120 | 0 | 120 | 120 |
| Dimensional change ratio (%) | MD-L1 | −0.015 | −0.018 | −0.017 | −0.014 | −0.030 | −0.026 | +0.003 |
|  | MD-L2 | −0.026 | −0.022 | −0.025 | −0.027 | −0.075 | −0.069 | −0.010 |
|  | MD-L3 | −0.017 | −0.019 | −0.020 | −0.029 | −0.081 | −0.071 | −0.008 |
|  | MD-L4 | −0.004 | −0.005 | −0.002 | −0.008 | −0.021 | −0.019 | +0.015 |
|  | Largest value to smallest value | 0.022 | 0.017 | 0.023 | 0.021 | 0.061 | 0.052 | 0.025 |
| Dimensional change ratio | | ◯ | ◯ | ◯ | ◯ | X | X | ◯ |
| Appearance (bulges) | | ◯ | ◯ | ◯ | ◯ | ◯ | ◯ | X |
| Assessment | | ◯ | ◯ | ◯ | ◯ | X | X | X |

From the results shown in Tables 1 and 2, it is apparent that when a laminated body obtained by laminating a polyimide resin film in which an adhesive layer containing thermoplastic polyimide is provided, and a metal foil is subjected to heat treatment under an inert gas atmosphere and a specific temperature and pressure, a flexible metal-clad laminated plate can be efficiently produced in a short time in which a dimensional change is evenly suppressed over the entire laminated body, and there are no bulges on a surface.

The present application is based on Japanese Patent Application filed to Japanese Patent Office on Jun. 3, 2016 (Japanese Patent Application No. 2016-111447), the disclosure of which is incorporated herein by reference.

INDUSTRIAL APPLICABILITY

A metal-clad laminated plate obtained by the manufacturing method of the present invention has industrial applicability as a member to be used for a flexible printed circuit board.

The invention claimed is:

1. A method for manufacturing a flexible metal-clad laminated plate, the method comprising steps of:
 (a) obtaining a laminated body by laminating a polyimide resin film including a non- thermoplastic polyimide layer and an adhesive layer containing thermoplastic polyimide, the adhesive layer being provided on at least one side of the non-thermoplastic polyimide layer, and a metal foil, wherein a linear expansion coefficient of the non-thermoplastic polyimide is in a range of 20 ppm or less, and a linear expansion coefficient of the thermoplastic polyimide is in a range of 20 ppm to 100 ppm; and
 (b) subjecting the laminated body obtained in the step (a) to heat treatment under an inert gas atmosphere and a pressure of 0.20 to 0.98 MPa at a temperature of a glass transition temperature Tg of the thermoplastic polyimide−20° C. to the glass transition temperature Tg+50° C.

2. The method according to claim 1, wherein in the step (a), the polyimide resin film and the metal foil are laminated.

3. The method according to claim 2, wherein in the step (b), the laminated body is subjected to heat treatment at a temperature of the glass transition temperature Tg of the thermoplastic polyimide−10° C. to the glass transition temperature Tg+30° C.

4. The method according to claim 3, wherein a heat treatment time in the step (b) is 60 to 420 minutes.

5. The method according to claim 4, wherein in the step (b), the laminated body has a roll shape.

6. The method according to claim 3, wherein in the step (b), the laminated body has a roll shape.

7. The method according to claim 2, wherein a heat treatment time in the step (b) is 60 to 420 minutes.

8. The method according to claim 7, wherein in the step (b), the laminated body has a roll shape.

9. The method according to claim 2, wherein in the step (b), the laminated body has a roll shape.

10. The method according to claim 1, wherein in the step (b), the laminated body is subjected to heat treatment at a temperature of the glass transition temperature Tg of the thermoplastic polyimide−10° C. to the glass transition temperature Tg+30° C.

11. The method according to claim 10, wherein a heat treatment time in the step (b) is 60 to 420 minutes.

12. The method according to claim 11, wherein in the step (b), the laminated body has a roll shape.

13. The method according to claim 10, wherein in the step (b), the laminated body has a roll shape.

14. The method according to claim 1, wherein a heat treatment time in the step (b) is 60 to 420 minutes.

15. The method according to claim 14, wherein in the step (b), the laminated body has a roll shape.

16. The method according to claim 1, wherein in the step (b), the laminated body has a roll shape.

17. The method according to claim 1, wherein the step (b) is carried out in an autoclave.

18. The method according to claim 1, wherein the glass transition temperature Tg of the thermoplastic polyimide is 240 to 290° C.

19. The method according to claim 1, wherein the flexible metal-clad laminated plate is a single-sided metal-clad laminated plate.

20. The method according to claim 1, wherein the flexible metal-clad laminated plate is a double-sided metal-clad laminated plate.

* * * * *